(12) United States Patent
Nale

(10) Patent No.: US 10,825,534 B2
(45) Date of Patent: Nov. 3, 2020

(54) PER ROW ACTIVATION COUNT VALUES EMBEDDED IN STORAGE CELL ARRAY STORAGE CELLS

(71) Applicant: Intel Corporation, Santa Clara, CA (US)

(72) Inventor: William Nale, Livermore, CA (US)

(73) Assignee: Intel Corporation, Santa Clara, CA (US)

(*) Notice: Subject to any disclaimer, the term of this patent is extended or adjusted under 35 U.S.C. 154(b) by 32 days.

(21) Appl. No.: 16/172,460

(22) Filed: Oct. 26, 2018

(65) Prior Publication Data

US 2019/0066808 A1 Feb. 28, 2019

(51) Int. Cl.

| | |
|---|---|
| *G11C 11/34* | (2006.01) |
| *G11C 16/34* | (2006.01) |
| *G11C 5/06* | (2006.01) |
| *G11C 7/10* | (2006.01) |
| *G11C 11/406* | (2006.01) |
| *G11C 7/02* | (2006.01) |
| *G11C 11/408* | (2006.01) |

(52) U.S. Cl.
CPC .......... *G11C 16/3418* (2013.01); *G11C 5/063* (2013.01); *G11C 7/02* (2013.01); *G11C 7/1072* (2013.01); *G11C 11/406* (2013.01); *G11C 11/4087* (2013.01); *G11C 2211/4065* (2013.01)

(58) Field of Classification Search
CPC ....... G11C 16/3418; G11C 5/063; G11C 7/02; G11C 7/1072; G11C 11/406; G11C 11/4087

USPC ...................................................... 365/185.02
See application file for complete search history.

(56) References Cited

U.S. PATENT DOCUMENTS

| | | | |
|---|---|---|---|
| 5,128,895 A * | 7/1992 | Park ...................... | G11C 16/10 365/104 |
| 9,087,554 B1 * | 7/2015 | Park ...................... | G11C 11/406 |
| 9,600,183 B2 | 3/2017 | Tomishima et al. | |
| 9,685,240 B1 * | 6/2017 | Park ................... | G11C 11/40615 |
| 9,779,798 B1 * | 10/2017 | Li ............................ | G11C 8/12 |
| 10,534,686 B2 * | 1/2020 | Mazumder ............ | G11C 11/408 |
| 2005/0071543 A1 | 3/2005 | Ellis et al. | |
| 2014/0085995 A1 | 3/2014 | Greenfield et al. | |
| 2014/0177370 A1 * | 6/2014 | Halbert ............. | G11C 11/40603 365/222 |
| 2014/0177376 A1 * | 6/2014 | Song .................... | G11C 29/783 365/230.03 |
| 2014/0281206 A1 * | 9/2014 | Crawford .............. | G11C 11/406 711/106 |
| 2015/0109871 A1 * | 4/2015 | Bains .................. | G06F 13/1636 365/222 |
| 2015/0200002 A1 * | 7/2015 | Lin ....................... | G11C 7/1072 711/106 |
| 2015/0279441 A1 * | 10/2015 | Greenberg ............ | G11C 11/406 365/49.1 |
| 2016/0078911 A1 * | 3/2016 | Fujiwara .............. | G11C 29/022 365/189.2 |
| 2016/0125931 A1 * | 5/2016 | Doo ...................... | G11C 11/406 365/222 |

(Continued)

*Primary Examiner* — Viet Q Nguyen
(74) *Attorney, Agent, or Firm* — Compass IP Law PC

(57) ABSTRACT

A DRAM memory having a storage cell array is described. The storage cell array has rows and columns. The storage cell array has reserved storage cells coupled to each of the rows. The reserved storage cells to store count values that individually count activations of each of the rows.

18 Claims, 6 Drawing Sheets

(56) References Cited

U.S. PATENT DOCUMENTS

| | | | |
|---|---|---|---|
| 2016/0202926 A1* | 7/2016 | Benedict | G11C 11/408 |
| | | | 711/106 |
| 2016/0211008 A1* | 7/2016 | Benedict | G11C 7/02 |
| 2016/0225433 A1* | 8/2016 | Bains | G11C 11/40618 |
| 2017/0011792 A1* | 1/2017 | Oh | G11C 11/40622 |
| 2017/0117030 A1* | 4/2017 | Fisch | G11C 11/406 |
| 2017/0186481 A1* | 6/2017 | Oh | G11C 11/40615 |
| 2017/0213586 A1* | 7/2017 | Kang | G06F 3/0619 |
| 2018/0061476 A1* | 3/2018 | Kim | G11C 11/40622 |
| 2018/0158507 A1* | 6/2018 | Bang | G11C 11/40603 |
| 2018/0197594 A1* | 7/2018 | Li | G11C 11/408 |
| 2018/0342282 A1* | 11/2018 | Morgan | G11C 29/50016 |
| 2019/0065079 A1* | 2/2019 | Lee | G06F 3/0673 |
| 2019/0347019 A1* | 11/2019 | Shin | G06F 3/0679 |

\* cited by examiner

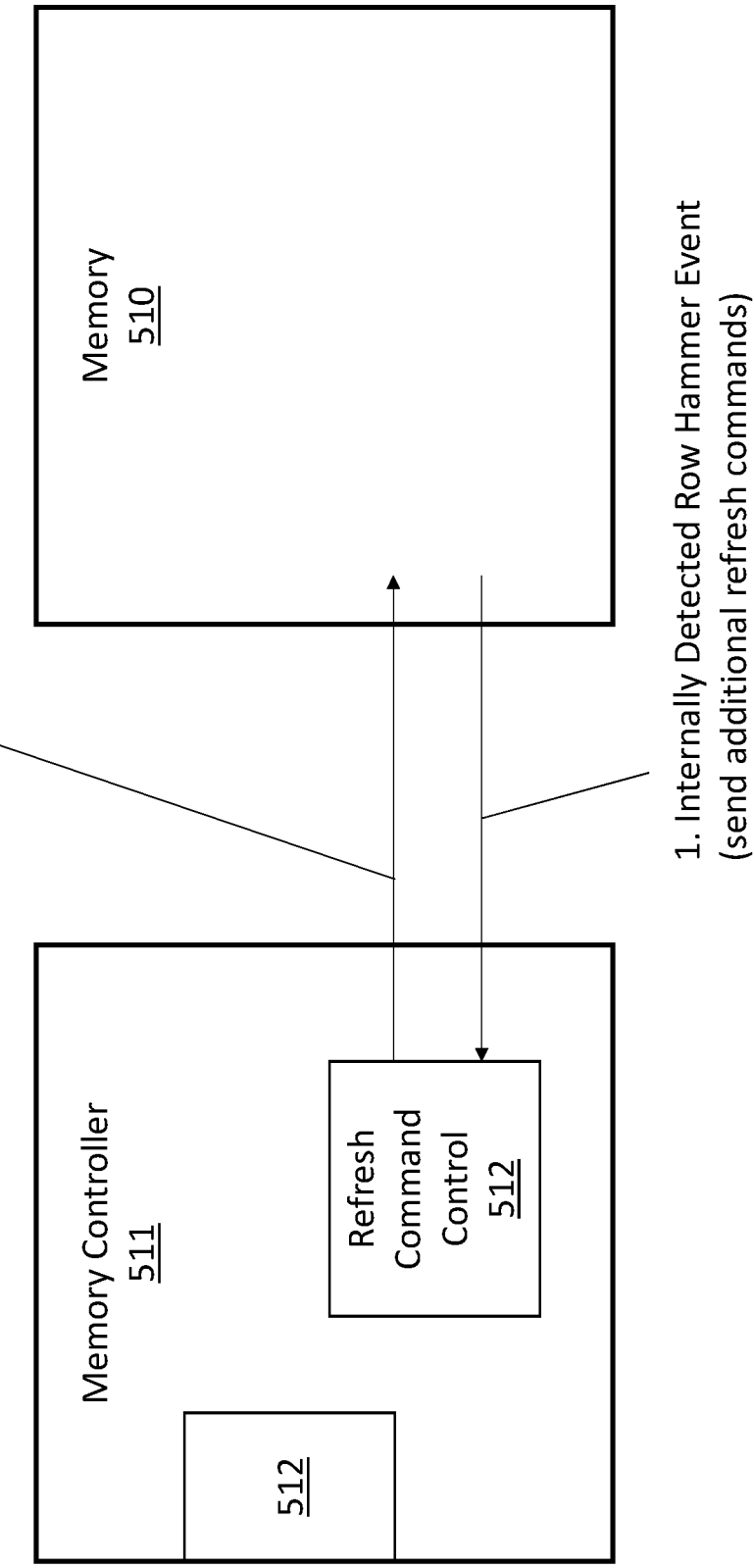

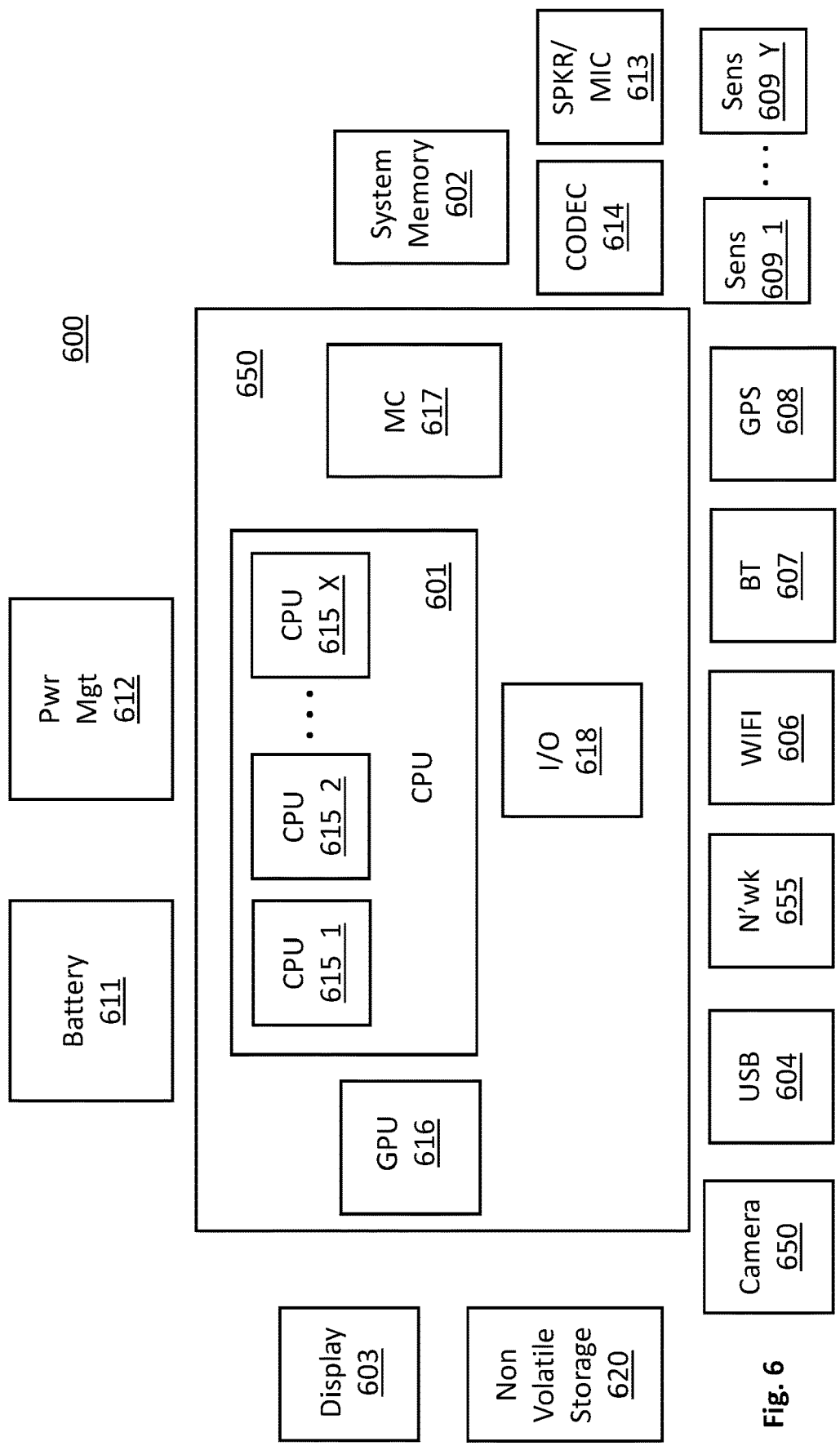

PER ROW ACTIVATION COUNT VALUES EMBEDDED IN STORAGE CELL ARRAY STORAGE CELLS

FIELD OF INVENTION

The field of invention pertains to the computing sciences, and, more specifically, to per row activation count values embedded in storage cell array storage cells.

BACKGROUND

DRAM memories are known to exhibit data disturbances/corruptions that are a function of how often row access lines of the storage cell array are activated. Unfortunately, as minimum feature sizes of DRAM memories continue to shrink, such disturbance/corruptions can be more prevalent. As such, designers of DRAM memories need to develop more sophisticated protections into their memory designs.

FIGURES

A better understanding of the present invention can be obtained from the following detailed description in conjunction with the following drawings, in which:

FIG. 5 shows a memory controller that can interface with the improved DRAM memory of FIG. 2;

FIG. 6 shows a computing system.

BACKGROUND

Figure 1:
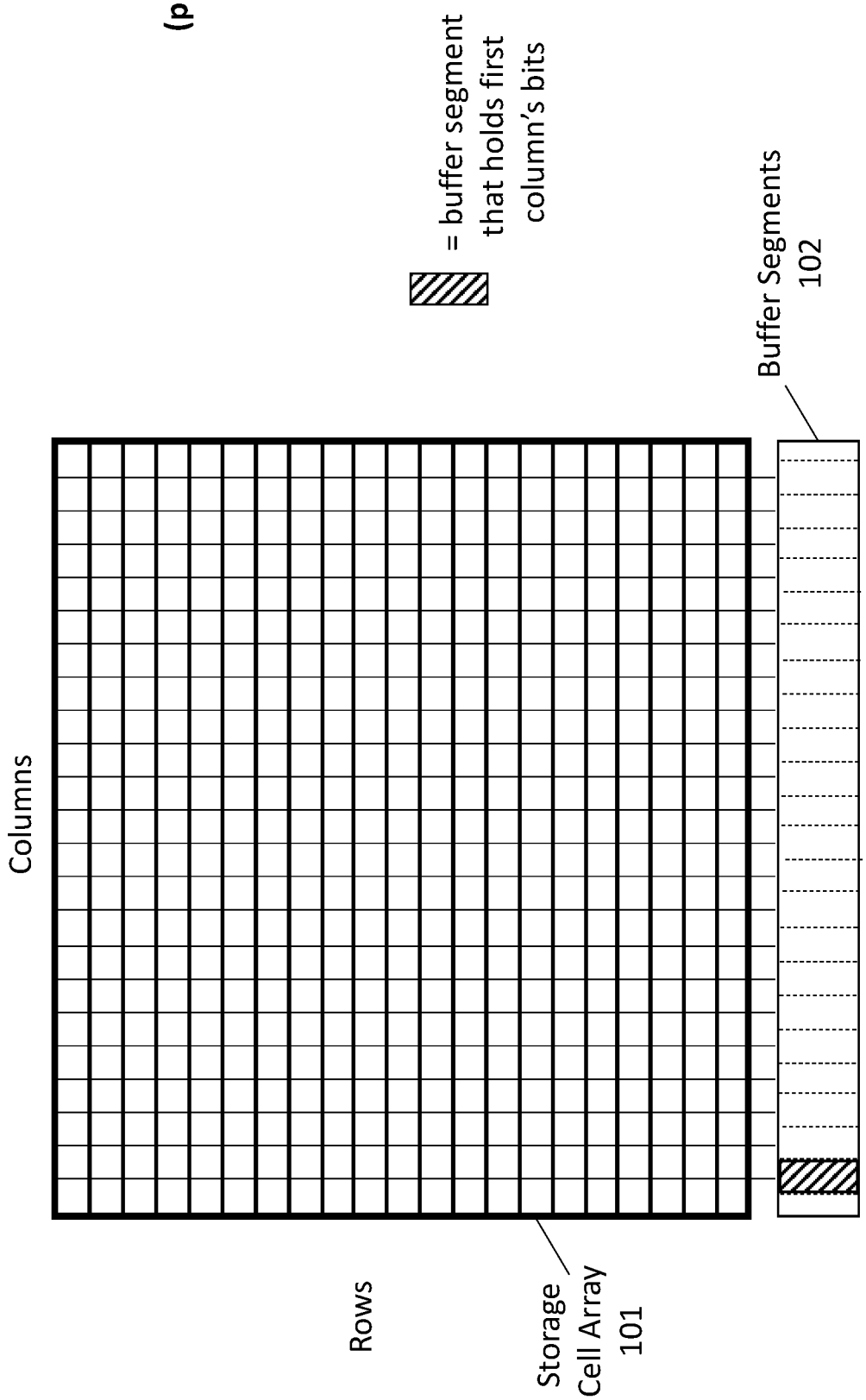
FIG. 1 shows a traditional DRAM memory.

Referring to FIG. 1, a dynamic random access memory (DRAM) memory is organized so that its storage cells 101 are arranged into an array 101 of multiple rows and columns. According to basic DRAM operation, when a particular read or write address is resolved to a particular row, the row is "activated" which activates the storage cells along all the columns that are coupled to the activated row.

In the case of a read, the storage cells that are coupled to the activated row are physically read from their storage locations and entered into sense amps of buffer segments 102 that are respectively aligned with the columns that are coupled to the activated row. The column address component of the read address is resolved to the particular buffer segment that holds the bits that were read along the column that the column address component of the read address corresponds to. These bits are then issued by the particular buffer segment to form the read response.

Because the read-out of the storage cells is destructive (the storage cells lose their data), the contents of all buffer segments 102 are subsequently written back into the storage cells to complete the read process. Note that in cases where consecutive read requests target a same row, the corresponding, individual buffer segments can be read out in rapid succession. That is, only one row activation and storage cell read-out into the buffer segments 102 is needed to service all of the consecutive read requests. Computing systems are often designed such that a "page" of memory content corresponds to the data that is stored along a row of a DRAM memory. Here, CPUs frequently access data on a same page in succession and can take advantage of multiple reads being supported by only a single row activation and buffer load.

In the case of a write, as with reads, the targeted row is activated and the storage cells of all columns that are coupled to the row are read-out and entered into the buffer segments 102. Write data is written over the content of the buffer segment that the column address of the write resolves to. The contents of all buffer segments 102 are then written back to their corresponding storage cells.

A problem with DRAM devices is "row hammer" data corruption. Here, if a row of a DRAM device is activated too frequently, data that is stored in storage cells that are coupled to neighboring rows can become corrupted (e.g., if row 5 is activated too many times, data stored along rows 4 and 6 can be corrupted). The precise number of activations of a particular "disturber" row that can cause row hammer corruption, and/or which specific neighboring rows of the disturber row can be victims of the disturber row's frequent access, depends on the manufacturing process of the DRAM (e.g., the narrower minimum feature size the fewer activations and/or the more neighboring row (e.g., first and second neighboring rows on either side of the frequently activated row)).

In order to address row hammer data corruption problems, memory controllers have been designed to keep track, in some fashion, of the number of times they have activated a particular row in the DRAM memory devices they send read/write requests to. For example, a memory controller may keep a register for each DRAM row and increment a count value in a particular row's register each time the row is activated. If a memory controller deems that a particular row has been activated a threshold number of times such that any more activations could victimize its neighboring rows, the memory controller will take affirmative steps to avoid such victimization.

In particular, the memory controller ensures that the potential victim rows are refreshed before activating the potential disturber row again.

Here, the storage cells of DRAM memories, being capacitive in nature, naturally lose their stored charge over time. As such, as part of nominal DRAM operation, DRAM storage cells are periodically refreshed so that they can continuously retain their data. Refreshing includes activating a row, reading out the storage cells that are coupled to the row, entering the data into the buffer segments and then writing the contents of the buffer segments 102 back into the storage cells. Here, the write back to the storage cells from the buffer segments 102 replenishes the storage cells' charge and guarantees their data integrity until their next scheduled refresh.

When a memory controller determines that a particular row is close to becoming a disturber row and victimizing one of its neighboring rows, the memory controller may delay any further accesses/activations of the row until the potential victim rows have been refreshed according to their normal/scheduled refresh. Alternatively the memory controller can proactively force unscheduled refreshes to the potential victim rows. After the potential victim rows have been refreshed, the tracking of the potential disturber row is reset. For example, if the memory controller maintains a register that counts each time the potential disturber row is activated, the memory controller resets the count to zero.

A problem, however, is the increasing storage densities of DRAM devices. Each new DRAM generation has greater storage capacity which, in turn, is physically realized with more rows per DRAM. With more rows per DRAM, it is becoming increasingly difficult for modern day memory controllers to keep track of activations on a per row basis. For example, considering the above described approach in which a separate activation count register is reserved for each different row the memory controller accesses, if the total DRAM capacity that the memory controller interfaces to corresponds to one million rows (or more), the amount of needed register space becomes too large for feasible integration into the memory controller.

Integration of per row count registers into the DRAM is also infeasible for the same reasons. Because activation counts have heretofore been implemented with logic registers, and because DRAM densities (including large numbers of rows) have been in existence for some time, present day row hammer solutions, whether in the memory controller or the DRAM, at best rely upon over conservative estimations.

That is, currently, a separate per row count does not exist (e.g., as presently implemented, at best, a single register count reflects activations across multiple rows). Therefore the memory controller and/or DRAM must rely on overly-conservative estimates as to what the row activation count is for each row. As a consequence, present day solutions trigger row hammer protection far more frequently than is actually necessary (by some estimates, 20 to 50 times more row hammer protections are triggered than what is actually needed).

Figure 2:
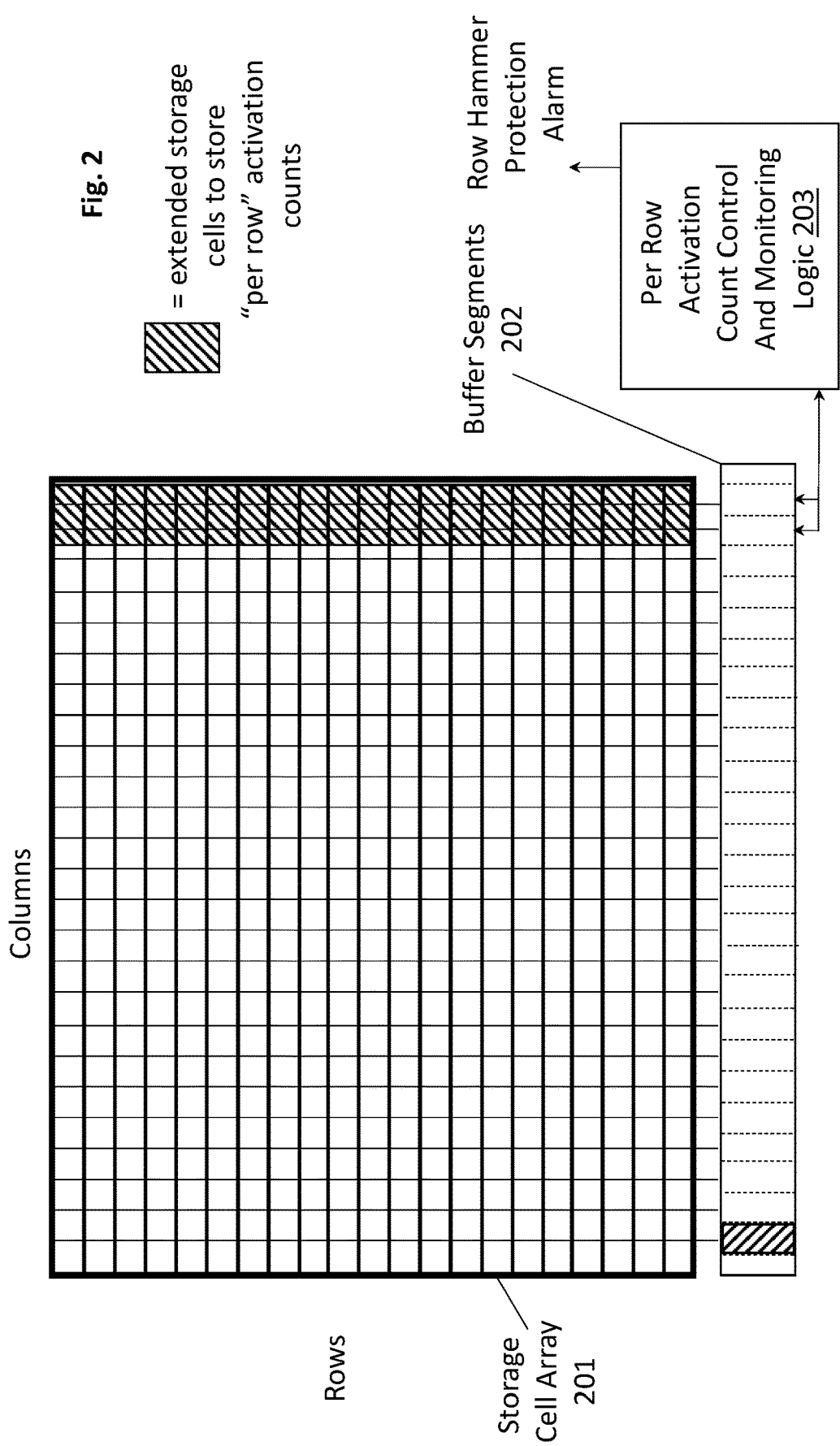
FIG. 2 shows an improved DRAM memory.

FIG. 2 shows a solution in which extended storage capacity is included along each row of a DRAM memory for keeping an activation count of each row. Here, the unshaded storage region of the storage array corresponds to the typical storage capacity of a traditional DRAM and includes: 1) storage cells for customer data; 2) error correction code (ECC) storage cells; and, 3) spare storage cells. Additionally, the shaded region of the storage array corresponds to extra storage cells that are coupled along each row in which activation count values are maintained for the DRAM rows (where the extra storage cells of a particular row hold the activation count value for that particular row).

Per row activation count control and monitoring logic circuitry 203 is also incorporated into the DRAM to update and monitor the per row activation count vales of each of the rows. The per row activation count logic circuitry 203 also triggers protective refreshes of potential victim rows as described in more detail further below.

Whereas incorporating per row activation count register space in a memory controller or DRAM is infeasible, as described above, because logic circuitry is used that emphasizes the formation of logic transistors that would consume too much semiconductor chip area, by contrast, the additional storage cells on each of the DRAM rows are formed with very small, tightly packed capacitive storage cells. As such, the additional storage region consumes significantly less semiconductor chip surface area than would be consumed to keep the same amount of information on the memory controller.

Importantly, the solution of FIG. 2 provides for "per row" activation counts, which heretofore have not been feasible for reasons described at length above. With true per-row activation counts, accurate activation counts can be maintained per row which, in turn, avoids overly-conservative row count estimation. As a consequence, a more ideal row hammer protection approach is realized in which far fewer unnecessary row hammer protection sequences are triggered than is believed to occur in present day systems. That is, the approach of FIG. 2 should yield a system in which row hammer protection sequences are triggered only when a row is truly in danger of having its data corrupted from the row hammer effect.

Referring to FIG. 2, a typical DRAM row is coupled to a few kilo-bytes worth of storage cells. If only two or three bytes of additional storage space is added to each row to accommodate the storage of per row activation count values, the storage capacity "overhead" to incorporate the storage of per row activation values is on the order of less than 1% (e.g., (3 bytes)/(1024 bytes)=0.3 percent. As suggested by FIG. 2, the extra count value storage cells could be realized with the addition of only a few extra columns per array. Note that only two bytes of extra storage space would provide for row activation count values of up to 65,536 which is greater than the maximum row activations of leading edge DRAM memories in the near future. Three bytes could be necessarily initially, but 2 bytes are likely to be sufficient in the near future (as manufacturing dimensions continue to decrease, fewer activations (smaller threshold counts) will raise a row hammer concern).

Figure 3:
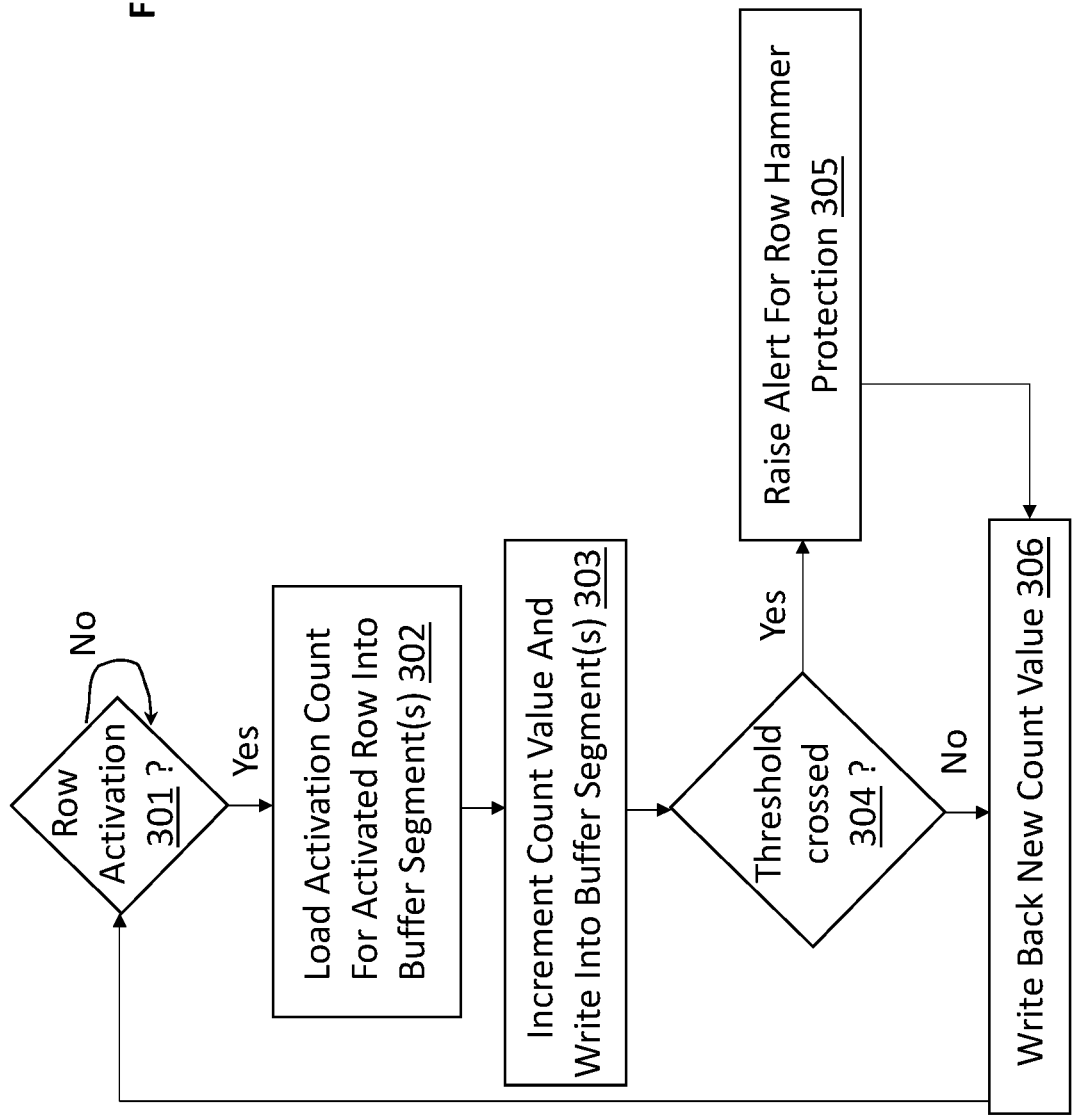
FIG. 3 shows a method performed by the improved DRAM memory of FIG. 2.
Figure 4:
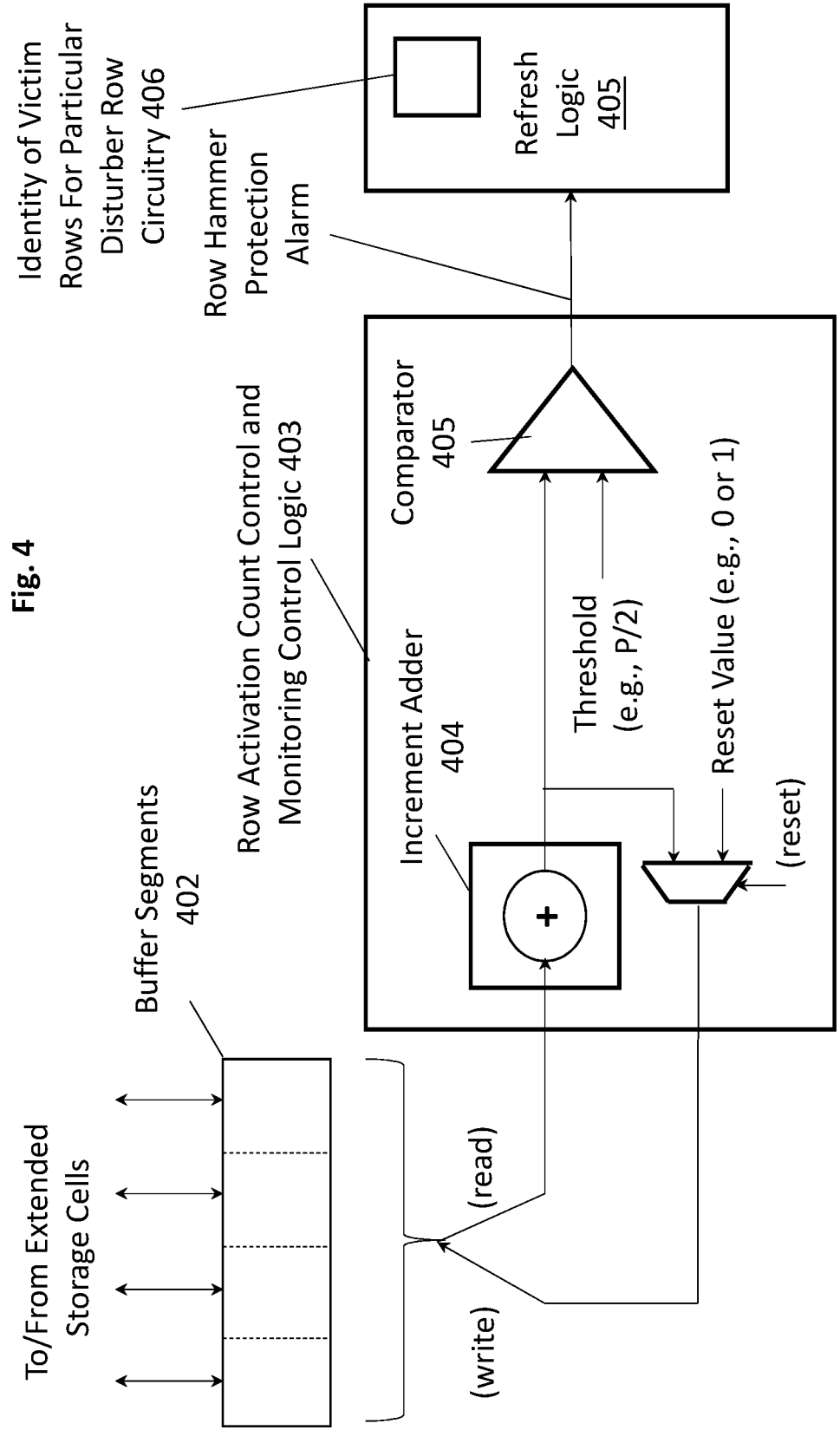
FIG. 4 shows logic circuitry of the improved DRAM memory of FIG. 2.

FIG. 3 shows a method that is performed by the DRAM and FIG. 4 shows a more detailed view of an embodiment 403 of the per row activation count control and monitoring logic circuitry 203 of FIG. 2. Referring to FIG. 3 and FIG. 4, each time a particular row is activated 301, whether for a read or write access, the activation count for the activated row is read from the extra storage cells and loaded 302 into the corresponding buffer segments 402 of the columns that are coupled to the extra storage cells.

The row activation count control and monitoring logic circuitry 403 reads the activation count value for the activated row from the corresponding buffer segments 402 and increments 303 the count value with adder logic circuitry 404. The row activation count control and monitoring logic circuitry 403 then compares 304 the incremented value against a threshold value, e.g., P/2, with comparator logic circuitry 405. If the incremented count value equals (or exceeds) the threshold value, the row activation count control and monitoring logic circuitry raises an alert signal 305 that row hammer protection is needed for the victim rows of the particular row that has just been activated.

The threshold value P/2 may be loaded or derived from a value (e.g., P) that is stored within the memory, e.g., within a mode register (MR) during boot-up or within read-only memory (ROM) circuitry (e.g., programmable fuse circuitry) that is written to during DRAM manufacture. In various embodiments the value P is a function of the processing technology of the DRAM chip and specifies how many activates a row can receive before it becomes a disturber.

In DRAM memories where a particular row can be victimized by the two immediately adjacent rows on either side of it, the threshold can be set to P/2 (if both adjacent rows receive P/2 activations, the row will observe P activations on either side of it which can result in a disturbance if either of the adjacent rows receive another activation). In DRAM memories where a particular row can be victimized by even more adjacent rows, e.g., the first and second immediately neighboring rows on both sides of the row (for a total of four disturber rows), the threshold can be set, e.g., to P/4. In some embodiments P is programmed into the memory device and the DRAM includes logic that divides P down to the correct threshold value (e.g., divide by 2 or divide by 4). In other embodiments, the threshold value (e.g., P/2, P/4, etc.) is programmed into the DRAM memory.

After the count value has been incremented it is stored back into the corresponding buffer segment(s). From there it is written back 306 into the extended storage cells of the storage cell array (commensurate with the writing back of the content of the nominal buffer segments into the nominal storage cells).

In various embodiments, in order to ensure that the row activation limit is not reached for any row, the threshold value is some value that is less than the actual physical limit normalized by the number of disturber rows per row to accommodate for worst case request streams (e.g., a set of imminent memory requests target the row that is in danger of becoming a disturber row) and the timing associated with the initiation of the refresh activity.

Present day DRAM devices have their refresh activity controlled by the memory controller. In various Joint Electron Device Engineering Council (JEDEC) industry standards the periodicity of the refresh commands are specified by a refresh interval characteristic (tREFI) that is specific to the DRAM. The DRAM further includes refresh logic circuitry 405 that keeps track of the per row refresh scheduling. That is, the refresh logic circuitry keeps track of an order in which rows are to be refreshed and where in the order the refresh activity currently stands. With each next refresh command that is received by the DRAM from the memory controller, the refresh logic circuitry 405 applies the command to (refreshes) the next row that needs refreshing according to the order. The refresh order then repeats after all rows in the order have been refreshed.

With the enhanced DRAM of FIG. 2 and the row activation count control and monitoring logic circuitry 203, 403, as described just above, if the activation count value of a just activated row crosses the threshold value, the refresh logic circuitry 405 is informed that the just activated row in at or nearing disturber status. In an embodiment, the refresh control logic circuitry 405 includes circuitry 406 that identifies the potential victim rows of the potential disturber row (e.g., a look-up table, logic circuitry that performs an algorithm that provides potential victim row identifications as a function of potential disturber row identification, etc.).

With the potential victim rows of the potential disturber row being known, the refresh control logic 405 refreshes them immediately, without additional refresh commands from the memory controller, if possible to do so. For example, the refresh control logic 405 may effectively "tack on" the refreshing of the victim rows to the most recently received refresh command from the memory controller.

However, conceivably in future DRAM generations a single disturber row may victimize more than its pair of immediately adjacent rows (e.g., it may victimize two rows on both of its sides for a total of four victimized rows). If the number of potential victim rows is too large and/or for other reasons the refresh logic is not able to immediately refresh the newly identified victim rows, the refresh logic 405, in various embodiments, is designed to reorder its refresh schedule so that the potential victim rows are refreshed sooner than later.

According to one embodiment the refresh logic 405 moves ahead in the schedule any potential victim rows that have not yet been refreshed according to the state of the order. According to a further embodiment, the refresh logic 405 re-characterizes any potential victim row that has already been refreshed according to the order as being in need of refreshing, and, places any such row ahead in the order of remaining rows that need refreshing. Said more simply, the refresh logic re-adjusts its refresh order so that the potential victim rows are next to be refreshed in the order.

In order to account for a row refresh order that refreshes a same row more than once in response to a row hammer alert, the refresh logic 405 may additionally initiate the sending of messages to the memory controller that instruct the memory controller to send more refresh commands than it nominally sends over a fixed time window to ensure proper refreshing (without row hammer adjustments). For example, if there are X rows to be refreshed in the nominal order and rows must be refreshed every Y seconds to preserve their data, the memory controller nominally will send X refresh commands equally spaced over Y seconds (i.e., a refresh command is sent every Y/X seconds) to refresh all X rows over Y seconds.

If the refresh logic 405 has to recharacterize an already refreshed row as in need of refreshing because it is a potential victim row of a newly identified potential disturber row, the refresh logic 405 will send a message to the memory controller that it needs to send an extra refresh command to accommodate the extra refresh of the recharacterized row. Here, the extra refresh command should be sent so that all other rows that nominally need refreshing are refreshed in time (within 1/Y seconds of their prior refresh).

This can be accommodated, e.g., by the memory controller sending two consecutive refresh commands instead of just one refresh command over the next Y/X time period that it is scheduled to send a refresh command within. Refresh commands can be scaled upward accordingly (e.g., if there are two extra refresh commands, the memory controller can send three refresh commands over the next Y/X time period).

As discussed above, present day DRAMs are able to absorb the extra refreshes without any additional refresh commands from the host. However, with current row hammer mitigation techniques in the DRAM, they may soon require a method to send more. With the improved approach described herein of actually tracking each row, far fewer row hammer refreshes are necessary and the need to ask the controller for more refresh commands is minimized or eliminated.

After the potential victim rows have been refreshed, the refresh logic 405 informs the activation count control and monitoring logic circuitry 403 that the victimization threat has been removed and the value that is stored for the row in the additional storage space of the no longer potential disturber row is to be cleared (reset to zero (or one)) the next time it receives it (if it does not currently possess it). In an alternate embodiment, the row activation count control and monitoring circuitry clears the count value during the same cycle it raises a row hammer alert signal (i.e., the count value is cleared and restored as part of the same cycle in which the count value crosses the row hammer threshold).

In a further embodiment, the activation count for a particular row is cleared, at the command of the refresh logic 405, when the set of its potential victim rows have been deemed to be refreshed according to the nominal refresh sequence. As described above, nominal refreshing includes refreshing rows in a particular order and then repeating. Here, in various embodiments, the set of potential victim rows for a particular disturber row can be deemed to have been refreshed when the disturber row is refreshed because the potential victim rows are typically refreshed just before and just after the potential disturber row is refreshed.

In a basic case where nominal refresh scheduling is performed in strict row order, focusing on row 5 as a potential disturber row as an example, the potential victim rows of row 5 (row 4 and row 6, or, rows 3,4 and rows 6,7) are all refreshed at approximately the same time as row 5's refreshing. As a consequence, row 5's activation counter can be cleared when row 5 is refreshed provided the preset value that triggers row hammer treatment is lowered slightly from one half the actual physical limit to account for additional activations that row 5 "could" receive in the time it takes its following victim row(s) (e.g., row 6 or rows 6 and 7) to be refreshed.

For example, if the memory has a cycle time of Z seconds, in one embodiment, the preset value is lowered so that the potential disturber row (e.g., row 5) can receive $N=Q*(Y/X))/(Z)$ activations between the time it is nominally refreshed and the time its most distant following victim row (e.g., row 7) is nominally refreshed without disturbing the distant victim row. Here: 1) Q is the number of locations in the order between the disturber row and the last of its victim rows in the order to be refreshed (in this example, Q=7−5=2); 2) (Y/X) is the time between consecutive refreshes; and, 3) Z is the memory cycle time to reflect that the disturber row can be re-activated on every memory cycle in a worst case scenario.

Thus, if the row hammer physical limit is P, the preset value for triggering row hammer treatment could be set to P/2−N in memory devices where a disturber victimizes its two immediately adjacent rows. In essence, this preset value accounts for re-activations of the disturber row that could occur between the nominal refreshing of the disturber row and its most distant, following victim row. Such refreshes would not properly be counted by the disturber row's counting mechanism, from the perspective of the most distant victim row, because the disturber row's count is cleared when it is refreshed.

Said another way, if the disturber row, after being refreshed, did not receive any re-activations between the time it was refreshed and the time its farthest victim row was refreshed, and then, after its farthest victim row was refreshed, the disturber row's activation count reached a value of (P/2)−1 just before the disturber row was refreshed again as part of the normal refreshing schedule/order, the disturber row could conceivably receive another N refreshes after it was refreshed but before its most distant victim row was refreshed. In this case, there would be (P/2)−1+N activations of the disturber row observed by the most distant victim row between the victim row's scheduled refreshes which could result in row hammer corruption of the victim row's data. By setting the preset value to the lower value of P/2−N, the memory would trigger refresh protection before the most distant victim row could observe more than P/2 activations of the disturber row, thereby avoiding row hammer disturbance of the most distant victim row.

The "distance" in the order between a potential disturber row and its farthest potential victim row can be used more generally to determine other reductions from the physical limit to account for refreshing orders other than strict in-order sequences. Here, as is known in the art, some memory devices (e.g., JEDEC DDR4 memory devices) provide for the memory controller to specify a custom refresh order that is different than a strict-in-order sequence. In this case, the distance in the order between a disturber row and its farthest victim row can be greater than distances determined by physical row location/number.

For example, if row 5 can disturb rows 3,4 and rows 6,7, and if, a custom refresh order establishes that row 3 would be refreshed eight order locations after row 5 was refreshed (the farthest from row 5 in the refresh order), then the appropriate preset value would be P/4−N where $N=Q*(Y/X))/(Z)$ and where Q=8. As such, the memory device may include additional logic circuitry to determine N and reduce P/4 by N to establish a threshold for declaring row hammer protection for any particular row. In additional embodiments, some restriction on custom refreshing order may be specified by the memory device so that N does not become too large.

In various embodiments the count could also be lowered to account for the time between the threshold being reached and the time when row hammer protection could actually be put into effect in a worst case scenario. This could be the maximum distance between two nominal refresh commands, which are sent by the host.

Note that keeping a true binary value for a row hammer's row activation count could create numerical sequences where more than one bit in the value changes on a next increment. For example, if the count value is 01111, a next increment results in a value of 10000 (all five bits change). In various embodiments an encoded count value is used that only changes one bit per increment (e.g., gray code encoding). Here, some DRAMs may have greater delay updating a count value if more bits may be changed on a particular increment. By using a code that keeps increments limited to only one or a few bits changes at most, any delay associated with updating the counter can be reduced/eliminated.

FIG. 5 depicts a memory controller 511 that could be used with a DRAM memory 510 as described above. As depicted in FIG. 5 the memory controller 511 includes refresh command control logic circuitry 512 that assists in row hammer treatment by sending 2 additional refresh commands to a memory device 510 in response to the memory device 510 informing 1 the memory controller 511 that additional refreshes are needed in order to handle a row hammer event that has been internally detected within the memory device 510 by the memory device 510. Moreover, the memory controller 511 may include configuration register space 512 that informs the memory controller whether or not the memory controller is coupled to a memory device that can perform its own internal row activation counts and associated information such as whether the memory device places restrictions on custom refresh orders and what such restrictions are.

Although embodiments described above have been directed to DRAM memories, it is conceivable that other memory technologies, such as any of a number of different emerging non volatile random access memory technologies may make use of the teachings herein to the extend such emerging technologies also exhibit row hammer or similar effects. That is, additional storage cells can be reserved in the storage arrays of such memories to keep counts of how many times their individual row, or other access line, has been activated or accessed (an activation of a DRAM row may be viewed more generally as an access of access line (or access wire) within the storage cell array).

A trend in computing system design is the integration of such emerging, new kinds of non volatile memory technologies (referred to generally as non volatile random access memory (NVRAM)) that operate significantly faster than traditional non volatile mass storage devices and/or support finer access granularities than traditional non volatile mass storage devices (which can only be accessed in "pages", "sectors" or "blocks" of data at least for certain types of accesses). With the emergence of NVRAM, traditional non volatile access/usage paradigms may be obviated/lessened in favor of new kinds of non volatile usage/access paradigms that treat non volatile resources more as a true random access memory than a traditional mass storage device.

Some possible examples include: 1) execution of byte addressable non volatile memory read and/or write instructions and/or commands; 2) physically accessing non volatile memory data at CPU cache line granularity; 3) operating software directly out of non volatile memory which behaves as true system memory or main memory (e.g., software main memory access read/write instructions executed by a CPU are completed directly at NVRAM rather than only at non volatile DRAM); 4) assignment of system/main memory address space to non volatile memory resources; 5) elimination and/or reduction of movement of "pages" of data between main memory and traditional mass storage device(s); 6) "commitment" of data as a mechanism of preserving the data (such as traditional database algorithms (e.g., two-phase commit protocol)) to NVRAM system memory rather than a traditional non volatile mass storage device; 7) accessing non volatile memory from a main memory controller rather than through a peripheral control hub; 8) existence of a multi-level system/main memory where the different levels have different access timing characteristics (e.g., a faster, "near memory" level composed of DRAM and slower "far memory" level composed of NVRAM); 9) existence of a "memory-side" cache at the front end of system/main memory (e.g., composed of DRAM) that caches the system/main memory's most requested items including items requested by components other than a CPU such as a display, peripheral, network interface, etc.

Possible technologies for NVRAM include phase change based memory, memory devices having storage cells composed of chalcogenide, a ferro-electric based memory (e.g., FRAM), a magnetic based memory (e.g., MRAM), a spin transfer torque based memory (e.g., STT-RAM), a resistor based memory (e.g., ReRAM), a Memristor based memory, universal memory, Ge2Sb2Te5 memory, programmable metallization cell memory, amorphous cell memory, Ovshinsky memory, "3D Xpoint" or "Optane" memory from Intel, Corp., etc. NVRAM technology may also manufacture a storage cell array as a three dimensional storage cell array, e.g., in and/or amongst the interconnect wiring above the semiconductor chip substrate, rather than as two dimensional array where the storage cells are embedded in the surface of the semiconductor chip substrate. Storage cells in the three dimensional storage cell array may also be accessed according to a cross-point physical access mechanism (e.g., a targeted cell resides between a pair of orthogonally oriented access wires in the chip's interconnect wiring).

FIG. 6 provides an exemplary depiction of a computing system 600 (e.g., a smartphone, a tablet computer, a laptop computer, a desktop computer, a server computer, etc.). As observed in FIG. 6, the basic computing system 600 may include a central processing unit 601 (which may include, e.g., a plurality of general purpose processing cores 615_1 through 615_X) and a main memory controller 617 disposed on a multi-core processor or applications processor, system memory 602, a display 603 (e.g., touchscreen, flat-panel), a local wired point-to-point link (e.g., USB) interface 604, various network I/O functions 605 (such as an Ethernet interface and/or cellular modem subsystem), a wireless local area network (e.g., WiFi) interface 606, a wireless point-to-point link (e.g., Bluetooth) interface 607 and a Global Positioning System interface 608, various sensors 609_1 through 609_Y, one or more cameras 610, a battery 611, a power management control unit 612, a speaker and microphone 613 and an audio coder/decoder 614.

An applications processor or multi-core processor 650 may include one or more general purpose processing cores 615 within its CPU 601, one or more graphical processing units 616, a memory management function 617 (e.g., a memory controller) and an I/O control function 618. The general purpose processing cores 615 typically execute the operating system and application software of the computing system. The graphics processing unit 616 typically executes graphics intensive functions to, e.g., generate graphics information that is presented on the display 603. The memory control function 617 interfaces with the system memory 602 to write/read data to/from system memory 602.

The system memory 602 or other memory (e.g., GPU local memory) may be designed according to the teachings above in which storage space in the memory arrays themselves are reserved to hold count values of array wire/lines (e.g., rows) that are used to access storage cells within the array so that row hammer effects can be avoided/mitigated.

The power management control unit 612 generally controls the power consumption of the system 600. Each of the touchscreen display 603, the communication interfaces 604-507, the GPS interface 608, the sensors 609, the camera(s) 610, and the speaker/microphone codec 613, 614 all can be viewed as various forms of I/O (input and/or output) relative to the overall computing system including, where appropriate, an integrated peripheral device as well (e.g., the one or more cameras 610). Depending on implementation, various ones of these I/O components may be integrated on the applications processor/multi-core processor 650 or may be located off the die or outside the package of the applications processor/multi-core processor 650. The computing system also includes non-volatile storage 620 which may be the mass storage component of the system.

Embodiments of the invention may include various processes as set forth above. The processes may be embodied in machine-executable instructions. The instructions can be used to cause a general-purpose or special-purpose processor to perform certain processes. Alternatively, these processes may be performed by specific/custom hardware components that contain hardwired logic circuitry or programmable logic circuitry (e.g., field programmable gate array (FPGA), programmable logic device (PLD)) for performing the processes, or by any combination of programmed computer components and custom hardware components.

Elements of the present invention may also be provided as a machine-readable medium for storing the machine-executable instructions. The machine-readable medium may include, but is not limited to, floppy diskettes, optical disks, CD-ROMs, and magneto-optical disks, FLASH memory, ROMs, RAMs, EPROMs, EEPROMs, magnetic or optical cards, propagation media or other type of media/machine-readable medium suitable for storing electronic instructions. For example, the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

The invention claimed is:

1. An apparatus, comprising:
a semiconductor chip comprising a memory controller to interface with a memory having a storage cell array and reserved storage cells within the storage cell array to keep counter values that count accesses to specific access lines within the storage cell array, the semiconductor chip comprising configuration register space that indicates whether the memory controller is coupled to the memory having the reserved storage cells, wherein, the counter values are expressed as gray code encodings that change only one bit per increment.

2. The apparatus of claim 1 wherein the memory is a dynamic random access memory (DRAM) memory.

3. The apparatus of claim 2 wherein the specific access lines are rows of the storage cell array of the DRAM memory.

4. The apparatus of claim 3 wherein the accesses are row activations.

5. The apparatus of claim 1 wherein the memory controller further comprises logic circuitry to send additional refresh commands to the memory in response to the memory requesting the additional refresh commands.

6. An apparatus, comprising:
a dynamic random access memory (DRAM) comprising a storage cell array, the storage cell array comprising rows and columns, the storage cell array comprising reserved storage cells coupled to each of the rows, the reserved storage cells to store count values that individually count activations of each of the rows, wherein, the count values are expressed as gray code encodings that change only one bit per increment.

7. The apparatus of claim 6 wherein the DRAM comprises logic circuitry to increment one of the count values when a corresponding row of the one of the count values is activated.

8. The apparatus of claim 7 wherein the logic circuitry further comprises comparison circuitry to determine when the one of the count values has crossed a threshold, the crossing of the threshold signifying that the corresponding row is a potential disturber row.

9. The apparatus of claim 8 wherein the logic circuitry is coupled to refresh circuitry within the DRAM, the refresh circuitry to refresh more than two potential victim rows of the potential disturber row in response to a signal sent by the logic circuitry.

10. The apparatus of claim 8 wherein the logic circuitry is to reset the count value after the logic circuitry detects that the count value has crossed the threshold.

11. The apparatus of claim 8 wherein the threshold is derived from a manufacturing technology specific parameter that is programmed into the DRAM.

12. The apparatus of claim 7 wherein the logic circuitry is to obtain the count values from one or more buffer segments that receive bits stored along columns of the storage cell array where the count values are stored in the storage cell array.

13. A computing system, comprising:
one or more processing cores;
a graphics processing unit;
a memory controller; and,
a dynamic random access memory (DRAM) coupled to the memory controller, the DRAM comprising a storage cell array, the storage cell array comprising rows and columns, the storage cell array comprising reserved storage cells coupled to each of the rows, the reserved storage cells to store count values that individually count activations of each of the rows, wherein the memory comprises refresh circuitry to refresh more than two potential victim access lines of an access line whose respective count value has reached a threshold, and wherein, the count values are expressed as gray code encodings that change only one bit per increment.

14. The computing system of claim 13 wherein the DRAM comprises logic circuitry to increment one of the count values when a corresponding row of the one of the count values is activated.

15. The computing system of claim 14 wherein the logic circuitry further comprises comparison circuitry to determine when the one of the count values has crossed a threshold, the crossing of the threshold signifying that the corresponding row is a potential disturber row.

16. An apparatus, comprising:
a memory comprising a storage cell array, the storage cell array comprising access lines coupled to respective storage cells of the storage cell array, the respective storage cells comprising reserved storage cells, the reserved storage cells to store count values that individually count accesses of their respective access lines, wherein the memory comprises refresh circuitry to refresh more than two potential victim access lines of an access line whose respective count value has reached a threshold, and wherein, the count values are expressed as gray code encodings that change only one bit per increment.

17. The apparatus of claim 16 wherein the memory is a non-volatile memory.

18. The apparatus of claim 16 wherein the memory comprises logic circuitry to increment one of the count values when a corresponding access line of the one of the count values is activated.

* * * * *